(12) United States Patent
Jun (10) Patent No.: US 12,367,379 B2
(45) Date of Patent: Jul. 22, 2025

(54) APPARATUS AND METHOD FOR DIAGNOSING SEMICONDUCTOR EQUIPMENT

(71) Applicant: SEMES CO., LTD., Chungcheongnam-do (KR)

(72) Inventor: Dong Hyun Jun, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 349 days.

(21) Appl. No.: 17/971,544

(22) Filed: Oct. 21, 2022

(65) Prior Publication Data

US 2023/0196078 A1 Jun. 22, 2023

(30) Foreign Application Priority Data

Nov. 30, 2021 (KR) .................. 10-2021-0168961

(51) Int. Cl.
*G06N 3/0464* (2023.01)
*G06N 5/045* (2023.01)
*H01L 21/66* (2006.01)

(52) U.S. Cl.
CPC .......... *G06N 3/0464* (2023.01); *G06N 5/045* (2013.01); *H01L 22/12* (2013.01)

(58) Field of Classification Search
CPC ....... G06N 5/045; G06N 3/0464; H01L 22/12
See application file for complete search history.

(56) References Cited

U.S. PATENT DOCUMENTS

| 7,221,991 | B2 | 5/2007 | Matsushita et al. |
| 11,029,359 | B2* | 6/2021 | Honda ............. G01R 31/31835 |
| 11,410,891 | B2* | 8/2022 | Phan ..................... G06N 3/044 |
| 2005/0194590 | A1 | 9/2005 | Matsushita et al. |
| 2022/0018790 | A1* | 1/2022 | Nakasato ........... G01N 21/9501 |

FOREIGN PATENT DOCUMENTS

| KR | 10-2008-0015363 | 2/2008 |
| KR | 10-0828026 | 5/2008 |
| KR | 10-2019-0030045 | 3/2019 |
| KR | 10-2020-0039049 | 4/2020 |
| KR | 10-2021-0017431 | 2/2021 |

OTHER PUBLICATIONS

Office Action dated Feb. 19, 2025 for Korean Patent Application No. 10-2021-0168961 and its English translation from Global Dossier.

* cited by examiner

*Primary Examiner* — An H Do
(74) *Attorney, Agent, or Firm* — WOMBLE BOND DICKINSON (US) LLP (57) ABSTRACT

The present invention provides an apparatus and method for diagnosing semiconductor equipment for analyzing a determination result and a cause of a defect for a substrate using a deep learning algorithm and explainable AI. The semiconductor equipment diagnosis method comprises acquiring time series data for a parameter related to a substrate treating process of a substrate treating apparatus, generating table information based on the time series data, converting the table information into image information based on data included in the table information, extracting and classifying a feature from the image information, determining whether a substrate treated by the substrate treating apparatus is good or defective based on the feature, and analyzing a cause of a defect of the substrate in response to determining that the substrate is defective.

18 Claims, 6 Drawing Sheets

| | Time | | | | |
|---|---|---|---|---|---|
| | $t_0$ | $t_1$ | $\cdots$ | $t_{m-1}$ | $t_m$ |
| $IO_1$ | 300 | 320 | $\cdots$ | 500 | 500 |
| $IO_2$ | 305 | 307 | $\cdots$ | 400 | 390 |
| $\cdots$ | 500 | 498 | $\cdots$ | 500 | 501 |
| $IO_{n-1}$ | 501 | 510 | $\cdots$ | 320 | 330 |
| $IO_n$ | 502 | 500 | $\cdots$ | 400 | 350 |

APPARATUS AND METHOD FOR DIAGNOSING SEMICONDUCTOR EQUIPMENT

This application claims the benefit of Korean Patent Application No. 10-2021-0168961, filed on Nov. 30, 2021, in the Korean Intellectual Property Office, the disclosure of which is incorporated herein by reference in its entirety.

BACKGROUND

1. Field

The present invention relates to an apparatus and method for diagnosing a semiconductor equipment. More particularly, it relates to an apparatus and method for diagnosing a semiconductor equipment using artificial intelligence (AI) technology.

2. Description of the Related Art

The semiconductor manufacturing process may be continuously performed in a semiconductor manufacturing equipment, and may be divided into a pre-process and a post-process. The semiconductor manufacturing facility may be installed in a space defined as a FAB to manufacture a semiconductor.

The pre-process refers to a process of forming a circuit pattern on a wafer to complete a chip. The pre-process may include a deposition process that forms a thin film on the wafer, a photo lithography process that transfers photo resist onto the thin film using a photo mask, an etching process that selectively removes unnecessary parts using chemical substances or reactive gases to from a desired circuit pattern on the wafer, an ashing process that removes the photoresist remaining after etching, and an ion implantation process that implants ions into a part connected to the circuit pattern to have characteristics of an electronic device, a cleaning process that removes contaminants from the wafer, and the like.

The post-process refers to the process of evaluating the performance of the product finished through the pre-process. The post-process may include the primary inspection process for selecting good and bad products by inspecting the operation of each chip on the wafer, the package process for cutting and separating each chip to form the shape of the product through dicing, die bonding, wire bonding, molding, and marking, and the final inspection process for finally inspecting product characteristics and reliability through electrical characteristic inspection, and burn-in inspection.

SUMMARY

TTTM (Tool To Tool Matching) may be applied to measure the performance and reliability of the semiconductor equipment used in the semiconductor manufacturing process. Here, TTTM refers to process improvement by using suitable semiconductor equipment and other semiconductor equipment compatible therewith.

TTTM may quantify and inform the difference for each TO. However, as the number of IOs increases, the amount of calculation also increases, and the TTTM result of each IO is not directly related to the quality of the product, so it is difficult to interpret the results.

The technical object of the present invention is to provide an apparatus and method for diagnosing a semiconductor equipment for performing a determination result and cause analysis thereof using a Convolutional Neural Network (CNN) and an eXplainable AI (XAI).

The objects of the present invention are not limited to the objects mentioned above, and other objects not mentioned will be clearly understood by those skilled in the art from the following description.

One aspect of the semiconductor equipment diagnosis method of the present invention for achieving the above technical object comprises acquiring time series data for a parameter related to a substrate treating process of a substrate treating apparatus, generating table information based on the time series data, converting the table information into image information based on data included in the table information, extracting and classifying a feature from the image information, determining whether a substrate treated by the substrate treating apparatus is good or defective based on the feature, and analyzing a cause of a defect of the substrate in response to determining that the substrate is defective.

Wherein the analyzing derives a parameter related to a cause of a defect of the substrate as a result.

Wherein the analyzing determines a replacement target part or a repair target part from among parts constituting the substrate treating apparatus based on a parameter related to a cause of a defect of the substrate.

Wherein the analyzing analyzes a cause of a defect of the substrate based on a TTTM (Tool To Tool Matching) result of the parameter over time, and the TTTM result is a result of comparing different substrates treated using the same substrate treating apparatus.

Wherein the analyzing analyzes a cause of a defect of the substrate using XAI (eXplainable AI).

Wherein the converting converts the table information into the image information using the number of the parameters, length of time related to the time series data, and the number of channels.

Wherein the generating generates the table information using information related to the parameter and information related to time.

Wherein the acquiring uses a value measured in the substrate treating apparatus when performing the substrate treating process with the parameter, and the parameter is at least one of pressure, temperature, flow rate and current.

Wherein the classifying extracts and classifies the feature from the image information using a CNN (Convolutional Neural Network) algorithm.

Further, another aspect of the semiconductor equipment diagnosis method of the present invention for achieving the above technical object comprises acquiring time series data for a parameter related to a substrate treating process of a substrate treating apparatus, generating table information based on the time series data, converting the table information into image information based on data included in the table information, extracting and classifying a feature from the image information, determining whether a substrate treated by the substrate treating apparatus is good or defective based on the feature, and analyzing a cause of a defect of the substrate in response to determining that the substrate is defective, wherein the analyzing analyzes a cause of a defect of the substrate using XAI based on a TTTM result of a parameter over time, derives a parameter related to a cause of a defect of the substrate as a result, and determines a replacement target part or a repair target part from among parts constituting the substrate treating apparatus, wherein the TTTM result is a result of comparing different substrates treated using the same substrate treating apparatus.

Further, one aspect of the semiconductor equipment diagnosis apparatus of the present invention for achieving the above technical object comprises a data acquiring module for acquiring time series data with respect to a parameter related to a substrate treating process of a substrate treating apparatus, a table generating module for generating table information based on the time series data, an image converting module for converting the table information into image information based on data included in the table information, a feature extracting module for extracting and classifying a feature from the image information, a determining module for determining whether a substrate treated by the substrate treating apparatus is good or defective based on the feature, and a cause analysis module for analyzing a cause of a defect of the substrate in response to determining that the substrate is defective.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

When an element or layer is referred as being located "on" another element or layer, it includes not only being located directly on the other element or layer, but also with intervening other layers or elements. On the other hand, when an element is referred as being "directly on" or "immediately on," it indicates that no intervening element or layer is interposed.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Unless otherwise defined, all terms (including technical and scientific terms) used herein may be used with the meaning commonly understood by those of ordinary skill in the art to which the present invention belongs. In addition, terms defined in a commonly used dictionary are not to be interpreted ideally or excessively unless clearly defined in particular.

Hereinafter, embodiments of the present disclosure will be described in detail with reference to the accompanying drawings, and in the description with reference to the accompanying drawings, the same or corresponding components are given the same reference numbers, regardless of reference numerals in drawings, and an overlapped description therewith will be omitted.

The present invention relates to an apparatus and method for diagnosing a semiconductor equipment for performing a determination result and cause analysis thereof using a Convolutional Neural Network (CNN) and an eXplainable AI (XAI). Hereinafter, the present invention will be described in detail with reference to drawings and the like.

Figure 1:
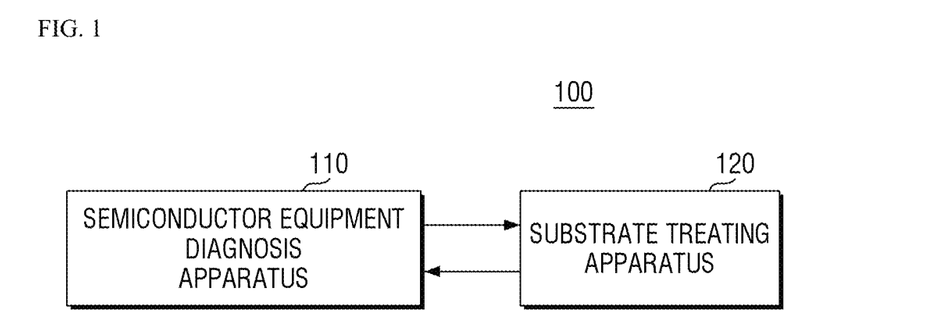
FIG. 1 is a diagram schematically illustrating an internal configuration of a semiconductor manufacturing equipment diagnosis system including a semiconductor equipment diagnosis apparatus according to an embodiment of the present invention.

FIG. 1 is a diagram schematically illustrating an internal configuration of a semiconductor manufacturing equipment diagnosis system including a semiconductor equipment diagnosis apparatus according to an embodiment of the present invention.

Referring to FIG. 1, a semiconductor manufacturing equipment diagnosis system 100 may include a semiconductor equipment diagnosis apparatus 110 and a substrate treating apparatus 120.

The semiconductor equipment diagnosis apparatus 110 is a device for diagnosing semiconductor equipment. The semiconductor equipment diagnosis apparatus 110 may diagnose, for example, the substrate treating apparatus 120 that treats a substrate (wafer).

The substrate treating apparatus 120 may be an apparatus that performs a cleaning process on a substrate. In this case, the substrate treating apparatus 120 may be provided as a cleaning process chamber. However, the present embodiment is not limited thereto. The substrate treating apparatus 120 may be an apparatus that performs an etching process on the substrate or an apparatus that performs a photo lithography process on the substrate.

When performing a cleaning process on the substrate, the substrate treating apparatus 120 may treat the substrate using a chemical solution. In this case, the substrate treating apparatus 120 may include a substrate support module 210, a treating solution recovery module 220, an elevating module 230, and a spray module 240 as shown in FIG. 2.

Figure 2:
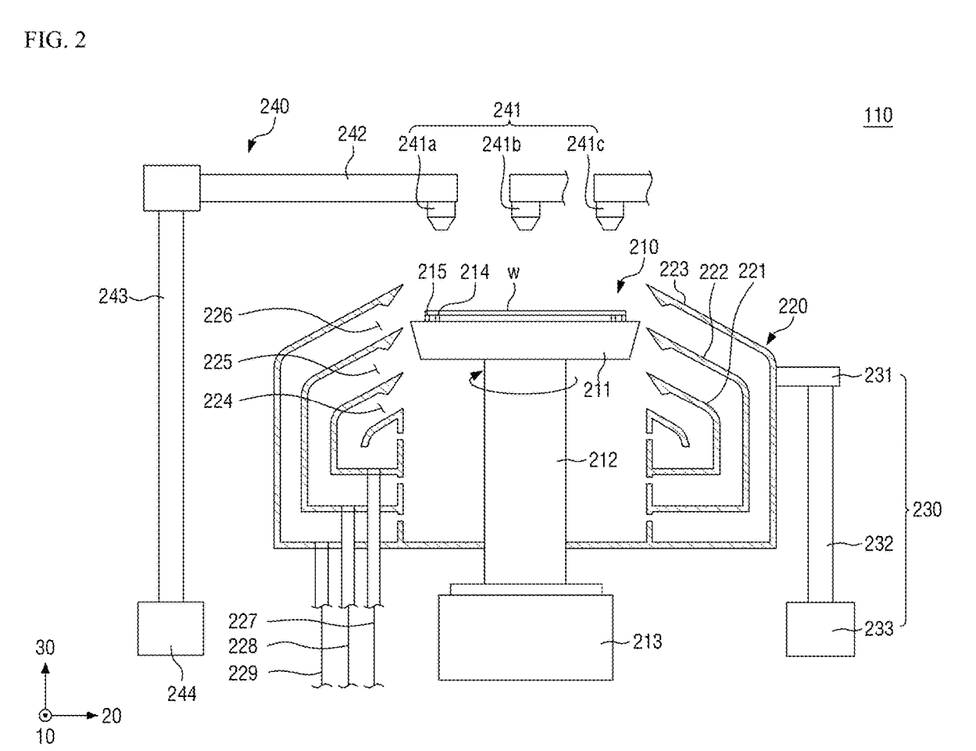
FIG. 2 is a diagram illustrating an internal structure of a substrate treating apparatus constituting the semiconductor manufacturing equipment diagnosis system of FIG. 1.

FIG. 2 is a diagram illustrating an internal structure of a substrate treating apparatus constituting the semiconductor manufacturing equipment diagnosis system of FIG. 1.

The chemical solution may be a liquid material (e.g., an organic solvent) or a gaseous material. The chemical solution is highly volatile and may contain substances with high fumes or high viscosity due to their high viscosity. The chemical solution may be selected from, for example, a substance containing an IPA (Iso-Propyl Alcohol) component, a substance containing a sulfuric acid component (e.g., SPM containing a sulfuric acid component and a hydrogen peroxide component), a substance containing an ammonia water component (e.g., SC-1 ($H_2CO_2^+NH_4OH$), a substance containing a hydrofluoric acid component (e.g., DHF (Diluted Hydrogen Fluoride)), and a substance containing a phosphoric acid component, etc. Hereinafter, the chemical solution used for treating the substrate W will be defined as a substrate treating solution.

The substrate support module 210 supports the substrate W. The substrate support module 210 may rotate the substrate W in a direction perpendicular to the third direction 30 (first direction 10 and second direction 20) when treating the substrate W. The substrate support module 210 may be disposed inside the treating solution recovery module 220 to recover the substrate treating solution used in treating the substrate W.

The substrate support module 210 may include a spin head 211, a rotation shaft 212, a rotation driving unit 213, a support pin 214, and a guide pin 215.

The spin head 211 rotates along the rotation direction of the rotation shaft 212 (vertical direction to the third direction 30). The spin head 211 may be provided to have the same shape as that of the substrate W. However, the present embodiment is not limited thereto. The spin head 211 may be provided to have a shape different from that of the substrate W.

The rotation shaft 212 generates rotational force using energy provided from the rotation driving unit 213. The rotation shaft 212 may be coupled to the rotation driving unit 213 and the spin head 211, respectively, to transmit the rotational force generated by the rotation driving unit 213 to the spin head 211. The spin head 211 rotates along the rotation shaft 212, and in this case, the substrate W seated on the spin head 211 may also rotate together with the spin head 211.

The support pin 214 and the guide pin 215 are to position and fix the substrate W on the spin head 211. The support pin 214 supports the bottom surface of the substrate W on the spin head 211 for this purpose, and the guide pin 215 supports the side surface of the substrate W. A plurality of support pins 214 and guide pins 215 may be respectively installed on the spin head 211.

The support pin 214 may be disposed to have an annular ring shape as a whole. The support pins 214 may support the bottom surface of the substrate W so that the substrate W is spaced apart from the upper portion of the spin head 211 by a predetermined distance.

The guide pin 215 is a chucking pin, and may support the substrate W so that the substrate W does not deviate from its original position when the spin head 211 rotates.

Meanwhile, a back nozzle (not shown) may also be installed in the upper portion of the spin head 211. The back nozzle is for cleaning the bottom surface of the substrate W. The back nozzle is installed in the upper center of the spin head 211 and may spray the substrate treating solution to the bottom surface of the substrate W.

The treating solution recovery module 220 recovers the substrate treating solution used in treating the substrate W. The treating solution recovery module 220 may be installed to surround the substrate support module 210, and thus may provide a space, in which a treating process for the substrate W is performed.

After the substrate W is seated and fixed on the substrate support module 210, when it starts to rotate by the substrate support module 210, the spray module 240 may be controlled by the control device to spray the substrate treating solution on the substrate W. Then, the substrate treating solution discharged onto the substrate W may be dispersed in a direction, in which the treating solution recovery module 220 is located, due to the centrifugal force generated by the rotational force of the substrate support module 210. In this case, when the substrate treating solution flows into the inside of the treating solution recovery module 220 through an inlet (i.e., a first opening 224 of a first recovery barrel 221, a second opening 225 of a second recovery barrel 222, and a third opening 226 of a third recovery barrel 223 to be described later), the treating solution recovery module 220 may recover the substrate treating solution.

The treating solution recovery module 220 may include a plurality of recovery barrels. The treating solution recovery module 220 may include, for example, three recovery barrels. When the treating solution recovery module 220 is configured to include a plurality of recovery barrels as described above, the substrate treating solution used in the substrate treating process may be separated and recovered using the plurality of recovery barrels, and thus the substrate treating solution can be recycled.

When the treating solution recovery module 220 is configured to include three recovery barrels, it may include a first recovery barrel 221, a second recovery barrel 222, and a third recovery barrel 223. The first recovery barrel 221, the second recover barrel 222, and the third recovery barrel 223 may be implemented as, for example, bowls.

The first recovery barrel 221, the second recovery barrel 222, and the third recovery barrel 223 may recover different substrate treating solutions. For example, the first recovery barrel 221 may recover water, the second recovery barrel 222 may recover a first chemical solution (e.g., any one of a substance containing an IPA component and a substance containing an SPM component), and the third recovery barrel 223 may recover a second chemical solution (e.g., the other one of a substance containing an IPA component and a substance containing an SPM component).

The first recover barrel 221, the second recovery barrel 222, and the third recovery barrel 223 may be connected to recovery lines 227, 228, 229 extending downward from the bottom surface (the third direction 30). The first treating solution, the second treating solution, and the third treating solution recovered through the first recovery barrel 221, the second recovery barrel 222, and the third recovery barrel 223 may be treated to be reusable through a treating solution regeneration system (not shown).

The first recovery barrel 221, the second recovery barrel 222, and the third recovery barrel 223 may be provided in an annular ring shape surrounding the substrate support module 210. The first recovery barrel 221, the second recovery barrel 222, and the third recovery barrel 223 may increase in size as it goes from the first recovery barrel 221 to the third recovery barrel 223 (that is, in the second direction 20). The interval between the first recovery barrel 221 and the second recovery barrel 222 is defined as a first interval, and the interval between the second recovery barrel 222 and the third recovery barrel 223 is defined as the second interval. Then, the first interval may be the same as the second interval. However, the present embodiment is not limited thereto. It is also possible that the first interval may be different from the second interval. That is, the first interval may be greater than the second interval, or may be smaller than the second interval.

The elevating module 230 linearly moves the treating solution recovery module 220 in the vertical direction (the third direction 30). The elevating module 230 may serve to adjust the relative height of the treating solution recovery module 220 with respect to the substrate support module 210 (or the substrate W) through this.

The elevating module 230 may include a bracket 231, a first support shaft 232, and a first driving unit 233.

The bracket 231 is fixed to the outer wall of the treating solution recovery module 220. The bracket 231 may be coupled to the first support shaft 232 that is moved in the vertical direction by the first driving unit 233.

When the substrate W is seated on the substrate support module 210, the substrate support module 210 may be located above the treating solution recovery module 220. Similarly, even when the substrate W is detached from the substrate support module 210, the substrate support module 210 may be located above the treating solution recovery module 220. In this case, the elevating module 230 may serve to lower the treating solution recovery module 220.

When the treating process for the substrate W is performed, the treating solution may be recovered into any one of the first recovery barrel 221, the second recovery barrel 222, and the third recovery barrel 223 according to the type of the substrate treating solution discharged onto the substrate W. Even in this case, the elevating module 230 may serve to elevate the treating solution recovery module 220 to a corresponding position. For example, when the first treating solution is used as the substrate treating solution, the elevating module 230 may elevate the treating solution recovery module 220 so that the substrate W is located at a height corresponding to the first opening 224 of the first recovery barrel 221.

Meanwhile, in the present embodiment, it is also possible to adjust the relative height of the treating solution recovery module 220 with respect to the substrate support module 210 (or the substrate W) by the elevating module 230 linearly moving the substrate support module 210 in the vertical direction.

However, the present embodiment is not limited thereto. It is also possible to adjust the relative height of the treating solution recovery module 220 with respect to the substrate support module 210 (or the substrate W) by the elevating module 230 linearly moving the substrate support module 210 and the treating solution recovery module 220 in the vertical direction at the same time.

The spray module 240 is to provide a liquid used in treating the substrate W to the substrate W. The spray module 240 may include a nozzle 241, a nozzle support unit 242, a second support shaft 243, and a second driving unit 244.

The nozzle 241 is installed at the end of the nozzle support unit 242. The nozzle 241 may be moved to a process position or a standby position by the second driving unit 244.

In the above, the process position refers to an upper region of the substrate W, and the standby position refers to the remaining region except for the process position. The nozzle 241 may be moved to the process position when discharging the substrate treating solution onto the substrate W, and after discharging the substrate treating solution onto the substrate W, the nozzle 24 may leave the process position and move to the standby position.

The spray module 240 may include a plurality of nozzles 241. In this case, the plurality of nozzles 241 may provide different liquids onto the substrate W. For example, the spray module 240 may include three nozzles 241a, 241b, and 241c. In this case, the first nozzle 241a may discharge the substrate treating solution onto the substrate W, and the second nozzle 241b may discharge a stripping liquid (e.g., de-ionized water (DIW)) onto the substrate W. In addition, the third nozzle 241c may discharge a removal liquid (e.g., iso-propyl alcohol (IPA)) onto the substrate W.

The nozzle support unit 242 supports the nozzle 241. The nozzle support unit 242 may be formed to extend in a direction corresponding to the longitudinal direction of the spin head 211. That is, the longitudinal direction of the nozzle support unit 242 may be provided along the second direction 20.

The nozzle support unit 242 may be coupled to a second support shaft 243 extending in a direction perpendicular to the longitudinal direction of the nozzle support unit 242. The second support shaft 243 may be formed to extend in a direction corresponding to the height direction of the spin head 211. That is, the second support shaft 243 may be provided with the longitudinal direction along the third direction 30.

The second driving unit 244 rotates and elevates the second support shaft 243 and the nozzle support unit 242 interlocked with the second support shaft 243. According to this function of the second driving unit 244, the nozzle 241 may be moved to a process position or a standby position.

Meanwhile, although not illustrated in FIG. 2, the substrate treating apparatus 120 may further include a substrate treating solution providing apparatus and a control apparatus.

The substrate treating solution providing apparatus is an apparatus for providing the substrate treating solution to the substrate treating apparatus 120. The substrate treating solution providing apparatus may be connected to the spray module of the substrate treating apparatus 120 for this purpose.

The control device is a device that controls the operation of the substrate treating apparatus 120. In this case, the control device may control, for example, the operation of the rotation driving unit 213 of the substrate support module 210, the first driving unit 233 of the elevating module 230, and the second driving unit 244 of the spray module 240 described with reference to FIG. 2.

The control device may be provided as a computer or a server, including a process controller, a control program, an input module, an output module (or a display module), a memory module, and the like. In the above, the process controller may include a microprocessor for executing a control function for each component constituting the substrate treating apparatus 120, and the control program may execute the various treating of the substrate treating apparatus 120 according to the control of the process controller. The memory module may store a program for executing various treating of the substrate treating apparatus 120 according to various data and treating conditions, that is, a treating recipe.

Meanwhile, the control apparatus may also control the operation of the substrate treating solution providing apparatus so that the substrate treating solution can be supplied from the substrate treating solution providing apparatus to the substrate treating apparatus 120 if necessary.

It will be described again with reference to FIG. 1.

When diagnosing the substrate treating apparatus 120, the semiconductor equipment diagnosis apparatus 110 may perform a determination result on the substrate and a cause analysis thereof using a convolutional neural network (CNN) and an eXplainable AI (XAI). Specifically, the semiconductor equipment diagnosis apparatus 110 may apply the CNN and XAI to time series data to perform a determination result on the substrate and cause analysis thereof. More specifically, the semiconductor equipment diagnosis apparatus 110 uses the CNN to determine whether the substrate treated by the substrate treating apparatus 120 is good or defective, and then when it is determined that the substrate is defective, the cause may be analyzed to derive the result using XAI.

Hereinafter, the role of the semiconductor equipment diagnosis apparatus 110 will be described in detail with reference to the drawings.

Figure 3:
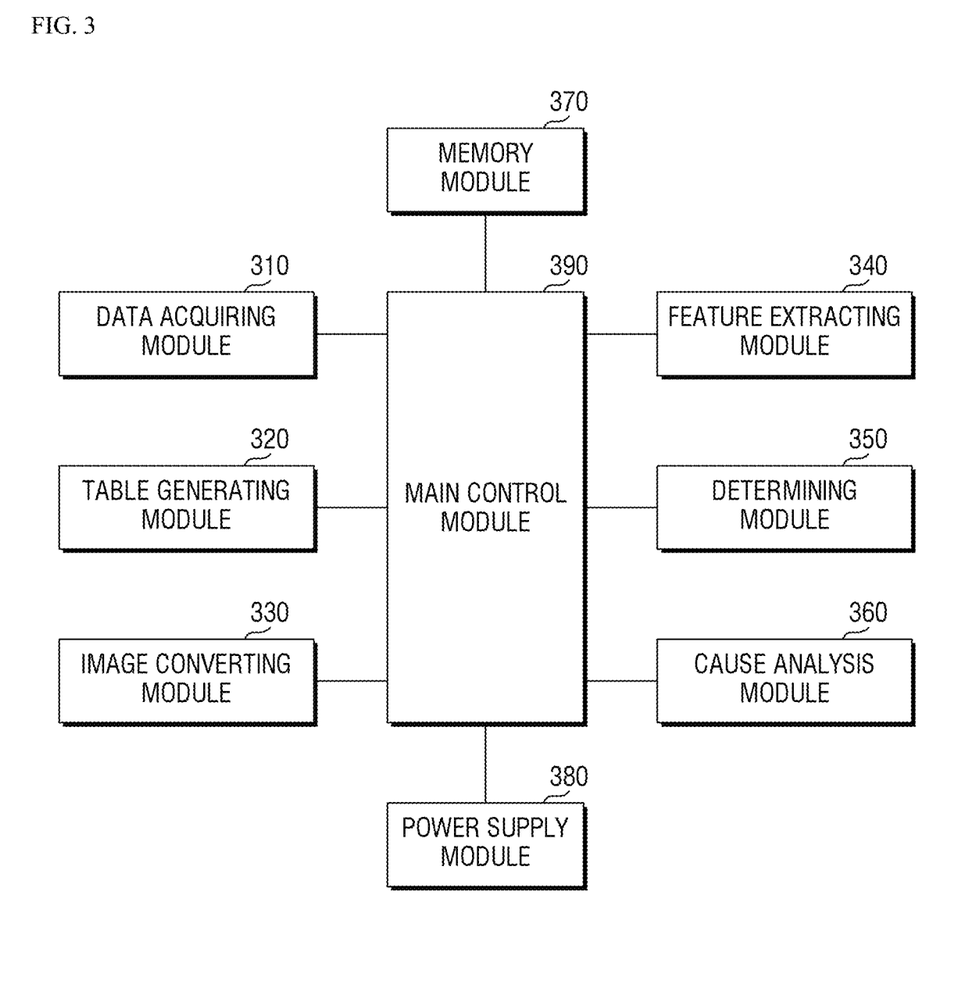
FIG. 3 is a block diagram schematically illustrating an internal module of a semiconductor equipment diagnosis apparatus according to an embodiment of the present invention.

FIG. 3 is a block diagram schematically illustrating an internal module of a semiconductor equipment diagnosis apparatus according to an embodiment of the present invention.

Referring to FIG. 3, the semiconductor equipment diagnosis apparatus 110 may include a data acquiring module 310, a table generating module 320, an image converting module 330, a feature extracting module 340, a determining module 350, and a cause analysis module 360.

The data acquiring module 310 acquires data measured during a substrate treating process of the substrate treating apparatus 120. The data acquiring module 310 may acquire data measured for each time, that is, time series data.

The data acquiring module 310 may acquire time series data for each parameter. Here, the parameters may include pressure, temperature, flow rate, current, and the like. That is, the parameter may be a value measured in the substrate treating apparatus 120 when the substrate treating apparatus 120 performs a substrate treating process.

The table generating module 320 generates table information by using the data acquired by the data acquiring module 310. The data acquired by the data acquiring module 310 is data measured fore each time according to parameters, and the table generating module 320 may generate table information using the parameters and time as factors.

Figure 4:
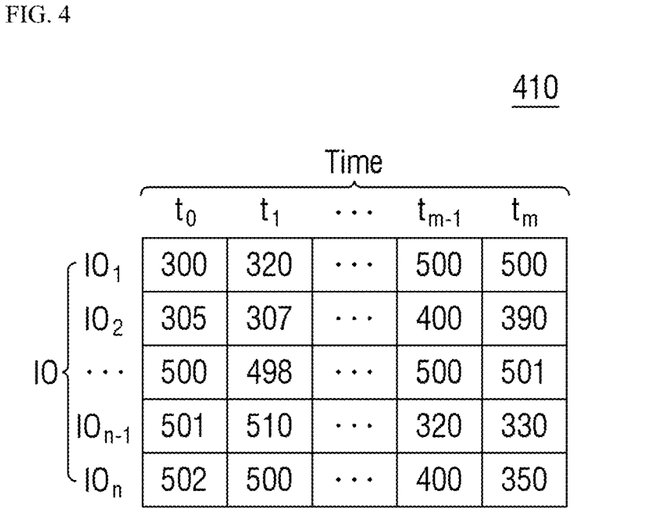
FIG. 4 is an exemplary view for describing a function of a table generating module constituting the semiconductor equipment diagnosis apparatus of FIG. 3.

For example, as shown in FIG. 4, the table generating module 320 may use m pieces of time data (Time; $t_0, t_1, \ldots, t_{m-1}, t_m$) as X-axis information, and n pieces of parameter data (IO; $IO_1, IO_2, \ldots, IO_{n-1}, IO_n$) as Y-axis information to generate the table information 410. That is, the table information 410 generated by the table generating module 320 may be formed by using the number of parameters (the number of IOs) n and the time length m as the X and Y axis. FIG. 4 is an exemplary view for describing a function of a table generating module constituting the semiconductor equipment diagnosis apparatus of FIG. 3.

The image converting module 330 converts the table information 410 generated by the table generating module 320 into image information. The image converting module 330 may convert the table information 410 into image information to use the n*m table information in the AI model, and may covert the table information 410 into image information based on the data included in the table generating module 320.

The image converting module 330 may apply the number of parameters to the width and apply the length of time to the height to convert the table information 410 into image information having the number of channels, width (or horizontal length) and height (or vertical length) as an element. In this case, the image information converted by the image converting module 330 may have the form of the number of channels*width*height.

In the above, the number of channels means the number of color information. When the image converting module 330 converts the table information 410 into color image information, the number of channels may be three (R, G, B), and when the image converting module 330 converts the table information 410 into black-and-white image information, the number of channels may be one.

Figure 5:
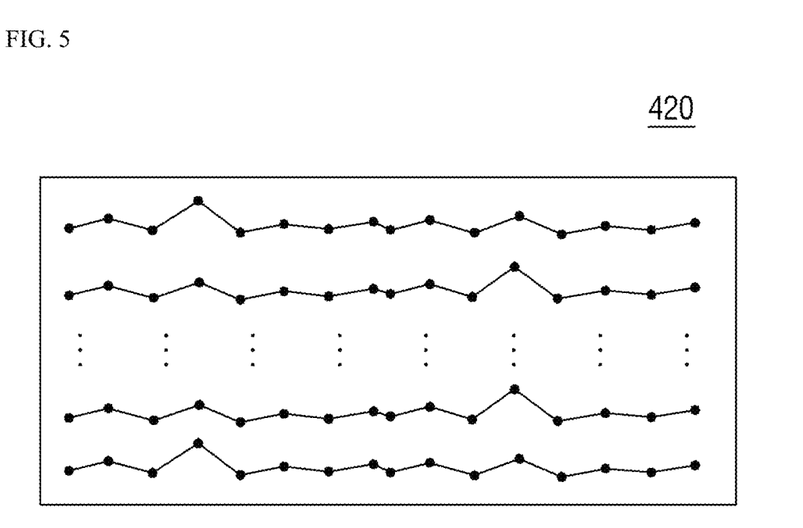
FIG. 5 is an exemplary view for describing the function of an image converting module constituting the semiconductor equipment diagnosis apparatus of FIG. 3.

When the number of parameters is applied to the width and the length of time is applied to the height, the image converting module 330 may convert it into the image information 420 shown in FIG. 5, that is, image information 420 having the form of 1 Channel*Number of IO*Time Length. In FIG. 4, when the number of rows is m and the number of columns is n, time series data may be represented as an array of the form [n, m]. Since the image information 420 can be represented as an array of the form [number of channels, horizontal length, vertical length], the time series data of FIG. 4 can be converted into the image information 420 whose channel is black and white (i.e., Channel 1), that is, an array of the form [1, n, m] as shown in FIG. 5.

However, the present embodiment is not limited thereto. The image converting module 330 may apply the length of time to the width and applies the number of parameters to the height to convert the table information 410 into image information having the number of channels, width, and height as elements. FIG. 5 is an exemplary view for describing the function of an image converting module constituting the semiconductor equipment diagnosis apparatus of FIG. 3.

The feature extracting module 340 extracts and classifies a feature from the image information converted by the image converting module 330. The feature extracting module 340 may extract a part constituting the substrate treating apparatus 120 or a value related to the substrate treating apparatus 120 as the feature.

The feature extracting module 340 may extract and classify a feature from image information using a deep learning algorithm. The feature extracting module 340 may use a neural network algorithm as a deep learning algorithm, for example, may use a Convolutional Neural Network (CNN) algorithm.

When extracting and classifying a feature from image information using a CNN algorithm, the feature extracting module 340 may extract the feature from the image information and perform classification based on the result. In this case, the feature extracting module 340 may configure a CNN model for TTTM (Tool To Tool Matching) to perform classification. As will be described later, the cause analysis module 360 may analyze the cause of the substrate defect using eXplainable AI (XAI). Since the result of XAI utilizes the contribution information for each class, it is necessary to know the class of the input value by performing classification. In this embodiment, in consideration of this point, the feature extracting module 340 may configure a CNN model for TTTM to perform classification.

On the other hand, the feature extracting module 340 may configure a CNN model for TTTM as a model architecture including Input-Cony-Batch Norm-ReLU-Conv-Batch Norm-ReLU-MaxP-Conv-Batch Norm-ReLU-FC-Probability of each class. Here, Input means data to be classified, Cony means convolution operation, and Batch Norm means batch normalization. In addition, ReLU means ReLU Layer as one of the activation functions, MaxP means Max Pooling, and FC means Fully Connected Layer. On the other hand, Probability of each class means the probability of each class.

The determining module 350 determines the state of the substrate treated by the substrate treating process of the substrate treating apparatus 120. In this case, the determining module 350 may determine the state of the substrate as good or defective, and may determine the state of the substrate based on the feature extracted and classified by the feature extracting module 340.

The cause analysis module 360 analyzes the cause of the defect based on the determination result of the determining module 350. That is, when it is determined that the substrate is defective by the determining module 350, the cause analysis module 360 may analyze the cause of the defect of the substrate and derive the result thereof.

The cause analysis module 360 may derive a parameter related to the cause of the defect of the substrate as a result. Also, the cause analysis module 360 may determine a replacement target part or a repair target part from among the parts constituting the substrate treating apparatus 120 based on the parameter related to the cause of the defect of the substrate.

The cause analysis module 360 may analyze the cause of the defect of the substrate based on the TTTM result of the parameter over time. In this case, the TTTM result may be a result of comparing different substrates treated using the same substrate treating apparatus. Alternatively, the TTTM result may be a result of comparing different substrate treating apparatuses treating the same substrate.

As described above, the cause analysis module 360 may use eXplainable AI (XAI) when analyzing the cause of the substrate defect. The main goal of XAI technology is to know the reason for AI's determination on the determination result when performing a specific task using AI. Using the XAI technology, it is possible to know which pixel of the image the AI looks at in identifying the image. In the present invention, when a substrate determined to be defective using this XAI technology occurs, it is possible to intuitively identify which parameter is the cause of the defect, that is which parameter was looked at in determining to be defective.

Figure 6:
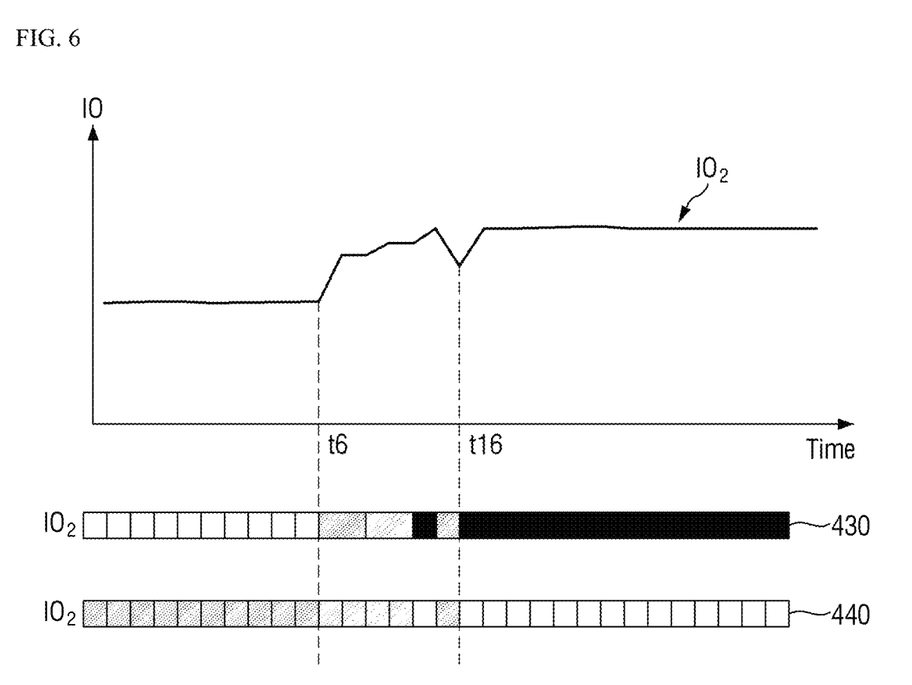
FIG. 6 is an exemplary view for describing the function of a cause analysis module constituting the semiconductor equipment diagnosis apparatus of FIG. 3.

For example, if the image information for $IO_2$ is as shown in FIG. 6, it can be intuitively identified that IO 2, that is, the temperature parameter corresponds to the cause of the substrate defect, and a problem occurred in the temperature parameter between $t_6$ and $t_{16}$. In FIG. 6, reference numeral 430 denotes a result of converting data into image information by the image converting module 330, and reference numeral 440 denotes an XAI result of the cause analysis module 360. FIG. 6 is an exemplary view for describing the function of a cause analysis module constituting the semiconductor equipment diagnosis apparatus of FIG. 3.

As described above, TTTM can quantify the difference for each parameter. However, like the TTTM result is 100% when the parameter is pressure, the TTTM result is 80% when the parameter is temperature, the TTTM result is 95% when the parameter is flow rate, and the TTTM result is 95% when the parameter is current, etc., the TTTM result for each parameter is not directly related to the quality of the product, so that it is difficult to analyze the cause of the defect of the substrate.

In the present invention, by applying CNN and XAI to time series data such as IO data, it is possible for the user to intuitively understand the quality of the product and to immediately identify the cause of the defect.

The purpose of TTTM is to compare process results for different equipment or different substrates within the same equipment, and to inform the difference. To this end, it is necessary to generate a feature for comparison, which requires domain knowledge, and the features for each equipment may be different, and the amount of calculation increases significantly as the number of features or the number of IOs increases. In addition, there is no correlation between features and failures, making it difficult to interpret the results. And since the results of the features appear as representative values, explanations referring to a specific time point are insufficient.

The present invention makes it possible to directly identify the cause by using AI technology to determine the good/defective of a substrate and present a criterion for determination. The CNN can be applied when determining the good/defective of a substrate, and the XAI can be applied when presenting a criterion for determination. In the present invention, by utilizing AI technology in this way, there are advantageous in that DDD (Data Driven Decision) is possible in various equipment, that is, model development is possible even if domain knowledge is insufficient, it is easy to expand, and the resources required for calculation after learning are relatively small.

On the other hand, the purpose of TTTM is to identify which IO (parameter data) is different comparing to the reference. In the present invention, by using XAI, it is also possible to obtain an effect of obtaining intuitive and superior results compared to the conventional TTTM of the statistical feature method.

The data acquiring module 310, the table generating module 320, the image converting module 330, the feature extracting module 340, the determining module 350 and the cause analysis module 360 have been described with reference to FIGS. 3 to 6. The modules 310 to 360 may be provided as software (e.g., a program) produced in the form of an algorithm. Alternatively, the modules 310 to 360 may be provided as a recording medium (e.g., HDD, SSD, USB memory, etc.), in which such software is recorded and stored. Alternatively, the modules 310 to 360 may be provided as a microprocessor operating the software. Alternatively, the modules 310 to 360 may be provided as a computer or server storing the software in a memory and having a microprocessor for operating the software. Here, the semiconductor equipment diagnosis apparatus 110 may be a microprocessor or a computer or server.

Meanwhile, the semiconductor equipment diagnosis apparatus 110 may further include a memory module 370, a power supply module 380, and a main control module 390. Here, the memory module 370 may store various data or information input to each module constituting the semiconductor equipment diagnosis apparatus 110, that is, the data acquiring module 310, the table generating module 320, the image converting module 330, the feature extracting module 340, the determining module 350 and the cause analysis module 360 or treated by the modules 310 to 360. The power supply module 380 may serve to supply power to each of the modules 310 to 360 constituting the semiconductor equipment diagnosis apparatus 110 to operate, and the main control module 390 may serve to control the overall operation of each of the modules 310 to 360 constituting the semiconductor equipment diagnosis apparatus 110.

Next, a method for diagnosing semiconductor equipment of the semiconductor equipment diagnosis apparatus 110 will be described.

Figure 7:
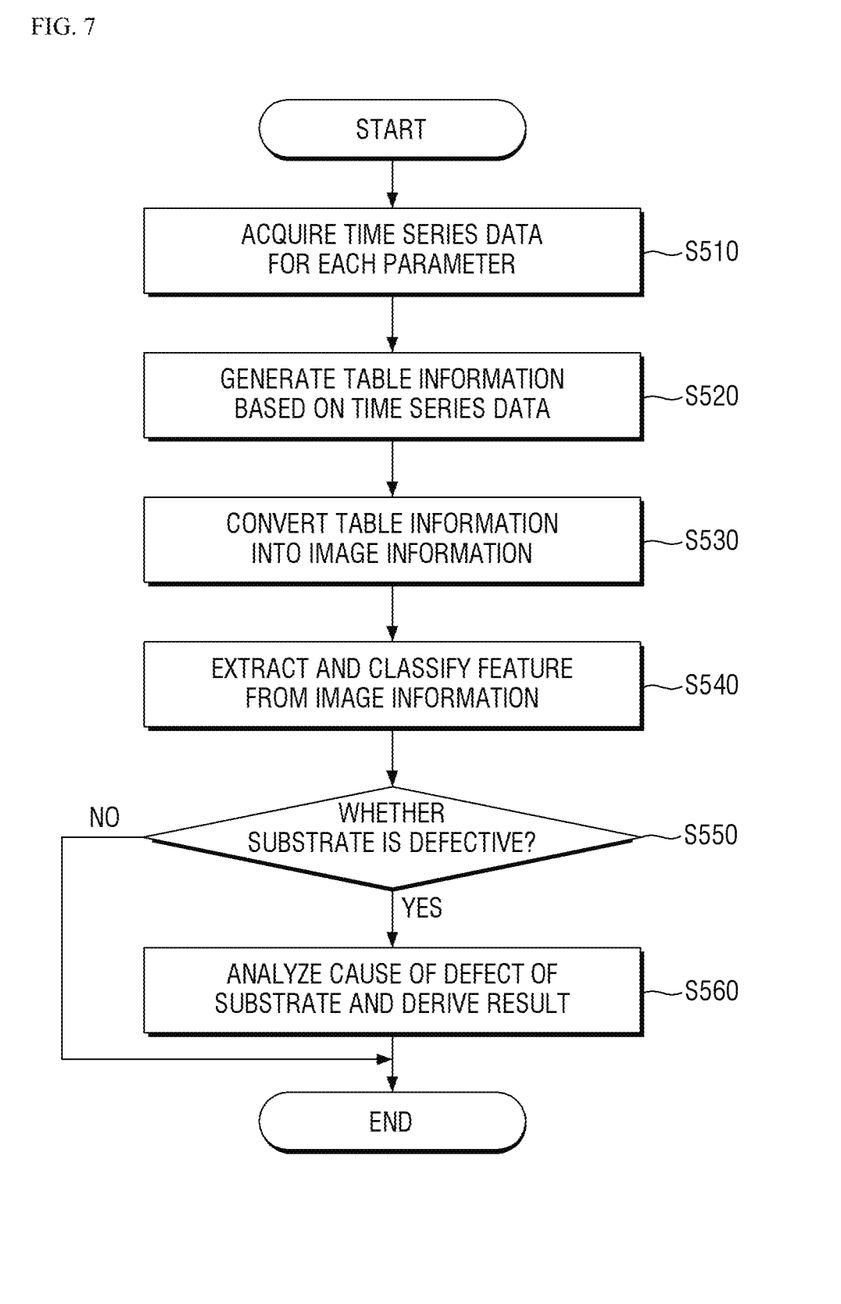
FIG. 7 is a flowchart sequentially illustrating a semiconductor equipment diagnosis method according to an embodiment of the present invention.

FIG. 7 is a flowchart sequentially illustrating a method for diagnosing a semiconductor equipment according to an embodiment of the present invention. The following description refers to FIGS. 3 and 7.

First, the data acquiring module 310 acquires time series data for each parameter related to the substrate treating process (S510).

Thereafter, the table generating module 320 generates table information 410 using parameters and time as variables based on the time series data (S520).

Thereafter, the image converting module 330 converts the table information 410 into image information 420 (S530). In this case, the image converting module 330 may convert the table information 410 into the image information 420 in consideration of the number of channels, the number of parameters, the length of time, and the like.

Then, the feature extracting module 340 extracts the feature from the image information 420 (S540). The feature extracting module 340 may extract a feature using, for example, a CNN algorithm.

Thereafter, the determining module 350 determines whether the substrate is good or defective based on the feature (S550).

If it is determined by the determining module 350 that the substrate is defective, the cause analysis module 360 analyzes the cause of the defect of the substrate and derives the result (S560). In this case, the cause analysis module 360 may analyze the cause of the defect of the substrate using, for example, XAI.

On the other hand, if the determining module 350 determines that the substrate is good, the cause analysis module 360 does not perform the cause analysis.

The apparatus for diagnosing semiconductor equipment 110 and its method, the semiconductor manufacturing equipment diagnostic system 100 and the substrate treating apparatus 120 including the apparatus for diagnosing semiconductor equipment 110 have been described above with reference to FIGS. 1 to 7. The present invention relates to a method of utilizing AI for feature-based TTTM. In the present invention, the state of a product can be diagnosed using an AI model, and cause analysis can be performed using XAI.

Although embodiments of the present invention have been described with reference to the above and the accompanying drawings, those skilled in the art, to which the present invention pertains, can understand that the present invention may be practiced in other specific forms without changing its technical spirit or essential features. Therefore, it should be understood that the embodiments described above are illustrative in all respects and not limiting.

What is claimed is:

1. A method for diagnosing a semiconductor equipment comprising:
    acquiring time series data for a parameter related to a substrate treating process of a substrate treating apparatus;
    generating table information based on information related to the parameter and information related to time of the time series data;
    converting the table information into image information based on the number of the parameters included in the information related to the parameter and length of the time related to the time series data;
    extracting and classifying a feature from the image information;
    determining whether a substrate treated by the substrate treating apparatus is good or defective based on the feature; and
    analyzing a cause of a defect of the substrate in response to determining that the substrate is defective,
    wherein elements of the image information comprise the number of channels, a width corresponding to the number of the parameters and a height corresponding to length of the time.

2. The method of claim 1, wherein the analyzing derives a parameter related to a cause of a defect of the substrate as a result.

3. The method of claim 2, wherein the analyzing determines a replacement target part or a repair target part from among parts constituting the substrate treating apparatus based on a parameter related to a cause of a defect of the substrate.

4. The method of claim 1, wherein the analyzing analyzes a cause of a defect of the substrate based on a TTTM (Tool To Tool Matching) result of the parameter over time.

5. The method of claim 4, wherein the TTTM result is a result of comparing different substrates treated using the same substrate treating apparatus.

6. The method of claim 1, wherein the analyzing analyzes a cause of a defect of the substrate using XAI (explainable AI).

7. The method of claim 1, wherein the acquiring uses a value measured in the substrate treating apparatus when performing the substrate treating process with the parameter.

8. The method of claim 7, wherein the parameter is at least one of pressure, temperature, flow rate and current.

9. The method of claim 1, wherein the classifying extracts and classifies the feature from the image information using a CNN (Convolutional Neural Network) algorithm.

10. A method for diagnosing a semiconductor equipment comprising:
    acquiring time series data for a parameter related to a substrate treating process of a substrate treating apparatus;
    generating table information based on information related to the parameter and information related to time of the time series data;
    converting the table information into image information based on the number of the parameters included in the information related to the parameter and length of the time related to the time series data;
    extracting and classifying a feature from the image information;

determining whether a substrate treated by the substrate treating apparatus is good or defective based on the feature; and analyzing a cause of a defect of the substrate in response to determining that the substrate is defective, wherein the analyzing analyzes a cause of a defect of the substrate using XAI based on a TTTM result of a parameter over time, derives a parameter related to a cause of a defect of the substrate as a result, and determines a replacement target part or a repair target part from among parts constituting the substrate treating apparatus, wherein the TTTM result is a result of comparing different substrates treated using the same substrate treating apparatus, and wherein elements of the image information comprise the number of channels, a width corresponding to the number of the parameters and a height corresponding to length of the time.

11. An apparatus for diagnosing a semiconductor equipment comprising:
a data acquiring module for acquiring time series data for a parameter related to a substrate treating process of a substrate treating apparatus;
a table generating module for generating table information based on information related to the parameter and information related to time of the time series data;
an image converting module for converting the table information into image information based on the number of the parameters included in the information related to the parameter and length of the time related to the time series data;
a feature extracting module for extracting and classifying a feature from the image information;
a determining module for determining whether a substrate treated by the substrate treating apparatus is good or defective based on the feature; and
a cause analysis module for analyzing a cause of a defect of the substrate in response to determining that the substrate is defective,
wherein elements of the image information comprise the number of channels, a width corresponding to the number of the parameters and a height corresponding to length of the time.

12. The apparatus of claim 11, wherein the cause analysis module derives a parameter related to a cause of a defect of the substrate as a result.

13. The apparatus of claim 12, wherein the cause analysis module determines a replacement target part or a repair target part from among parts constituting the substrate treating apparatus based on a parameter related to a cause of a defect of the substrate.

14. The apparatus of claim 11, wherein the cause analysis module analyzes a cause of a defect of the substrate based on a TTTM result of the parameter over time.

15. The apparatus of claim 14, wherein the TTTM result is a result of comparing different substrates treated using the same substrate treating apparatus.

16. The apparatus of claim 11, wherein the cause analysis module analyzes a cause of a defect of the substrate using XAI.

17. The apparatus of claim 11, wherein the image converting module converts the table information into the image information using the number of the parameters, length of time related to the time series data, and the number of channels.

18. The apparatus of claim 11, wherein the data acquiring module uses a value measured in the substrate treating apparatus when performing the substrate treating process with the parameter.

* * * * *